United States Patent
Yamato

(10) Patent No.: US 10,106,704 B2
(45) Date of Patent: Oct. 23, 2018

(54) POLISHING COMPOSITION, POLISHING METHOD, AND METHOD FOR PRODUCING SUBSTRATE

(71) Applicant: FUJIMI INCORPORATED, Kiyosu-shi, Aichi (JP)

(72) Inventor: Yasuyuki Yamato, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 15/126,513

(22) PCT Filed: Mar. 9, 2015

(86) PCT No.: PCT/JP2015/056789
§ 371 (c)(1),
(2) Date: Sep. 15, 2016

(87) PCT Pub. No.: WO2015/141505
PCT Pub. Date: Sep. 24, 2015

(65) Prior Publication Data
US 2017/0081552 A1 Mar. 23, 2017

(30) Foreign Application Priority Data

Mar. 20, 2014 (JP) .................................. 2014-057480

(51) Int. Cl.
| | | |
|---|---|---|
| H01L 21/302 | (2006.01) | |
| H01L 21/461 | (2006.01) | |
| H01L 21/311 | (2006.01) | |
| C03C 15/00 | (2006.01) | |
| C03C 25/68 | (2006.01) | |
| C09G 1/02 | (2006.01) | |
| C09K 3/14 | (2006.01) | |
| H01L 21/321 | (2006.01) | |
| H01L 21/306 | (2006.01) | |
| C09G 1/04 | (2006.01) | |
| H01L 21/3105 | (2006.01) | |
| H01L 21/768 | (2006.01) | |

(52) U.S. Cl.
CPC ................ *C09G 1/02* (2013.01); *C09G 1/04* (2013.01); *C09K 3/14* (2013.01); *C09K 3/1409* (2013.01); *C09K 3/1436* (2013.01); *C09K 3/1454* (2013.01); *C09K 3/1463* (2013.01); *H01L 21/30625* (2013.01); *H01L 21/31053* (2013.01); *H01L 21/3212* (2013.01); *H01L 21/32115* (2013.01); *H01L 21/7684* (2013.01)

(58) Field of Classification Search
None
See application file for complete search history.

(56) References Cited

U.S. PATENT DOCUMENTS

| 6,143,662 | A | 11/2000 | Rhoades et al. |
|---|---|---|---|
| 2004/0067649 | A1 | 4/2004 | Hellring et al. |
| 2005/0113000 | A1 | 5/2005 | Belov et al. |
| 2005/0126080 | A1 | 6/2005 | Kon et al. |
| 2005/0208883 | A1* | 9/2005 | Yoshida ............... B24B 37/044 451/41 |
| 2007/0202703 | A1 | 8/2007 | Shimizu et al. |
| 2007/0218811 | A1 | 9/2007 | Kurata et al. |
| 2008/0057713 | A1 | 3/2008 | Desai et al. |
| 2009/0181539 | A1 | 7/2009 | Kon et al. |
| 2010/0001229 | A1 | 1/2010 | Nakagawa et al. |
| 2011/0183581 | A1 | 7/2011 | Otsu et al. |
| 2013/0005219 | A1 | 1/2013 | Takemura et al. |
| 2013/0146804 | A1* | 6/2013 | Mizuno .................... C09G 1/02 252/79.1 |
| 2014/0094033 | A1* | 4/2014 | Yamato ............. H01L 21/31053 438/693 |
| 2014/0349484 | A1 | 11/2014 | Yokota et al. |
| 2015/0069291 | A1 | 3/2015 | Jung |
| 2015/0072522 | A1 | 3/2015 | Jung |
| 2015/0132955 | A1 | 5/2015 | Yamato et al. |

FOREIGN PATENT DOCUMENTS

| CN | 1637110 A | 7/2005 |
|---|---|---|
| CN | 102741985 A | 10/2012 |
| EP | 2 610 031 A1 | 7/2013 |
| JP | 2007-234784 A | 9/2007 |
| JP | 2007-335847 A | 12/2007 |
| JP | 2010-56127 A1 | 3/2010 |
| JP | 2011-513991 A | 4/2011 |
| JP | 2011-181884 A | 9/2011 |
| JP | 2011-181946 A | 9/2011 |
| JP | 2015-053101 A | 3/2015 |
| JP | 2015-054967 A | 3/2015 |
| JP | 2015-054970 A | 3/2015 |
| TW | 201341515 A | 10/2013 |

(Continued)

OTHER PUBLICATIONS

Chinese Office Action and its English translation thereof issued in corresponding application No. 201580015247.3 dated Apr. 4, 2018.

*Primary Examiner* — Stephanie P Duclair
(74) *Attorney, Agent, or Firm* — Foley & Lardner LLP

(57) ABSTRACT

To provide a polishing composition that can be used as an alternative of a polishing composition containing cerium oxide abrasive grains in STI and other such CMP applications, and to provide a polishing method and a method for producing a substrate using this polishing composition.

A polishing composition being used in applications for polishing a layer that contains a substance having a pH range presenting a positive zeta potential in an aqueous solution of pH 6 or lower, wherein the polishing composition contains abrasive grains (A), abrasive grains (B), and a pH adjusting agent, and the abrasive grains (B) has a negative zeta potential in an aqueous solution of pH 6 or lower, and the value of the average secondary particle diameter of the abrasive grains (B) is less than the value of the average secondary particle diameter of the abrasive grains (A) and is 15 nm or less and the polishing composition has a pH of 6 or lower.

8 Claims, No Drawings

(56) References Cited

FOREIGN PATENT DOCUMENTS

| WO | WO 2004/010487 A1 | 1/2004 |
| WO | WO 2008/032681 A1 | 3/2008 |
| WO | WO 2009/154164 A1 | 12/2009 |
| WO | 2012026329 * | 3/2012 |
| WO | WO-2012172983 A1 * | 12/2012 ....... H01L 21/31053 |
| WO | WO-2013/172111 A1 | 11/2013 |

* cited by examiner

POLISHING COMPOSITION, POLISHING METHOD, AND METHOD FOR PRODUCING SUBSTRATE

TECHNICAL FIELD

<Technical Field>

The present invention relates to a polishing composition, a polishing method, and a method for producing a substrate.

BACKGROUND ART

<Related Art>

Conventionally, a new fine processing technology has been developed in accordance with high integration and high performance of LSI. A chemical mechanical polishing (hereinafter, also simply referred to as CMP) method is one of those technologies, and CMP is often used in an LSI manufacturing process, particularly in processes such as shallow trench isolation (STI), planarization of interlayer dielectric films (ILD films), formation of tungsten plugs, and formation of multilayer interconnections composed of copper and a low dielectric film. Among them, in STI, a layer that contains a substance having a pH range exhibiting a positive zeta potential in an aqueous solution of pH 6 or lower (for example, a layer of silicon nitride) is used as a stopper and a layer of silicon oxide is generally polished and removed by CMP, for example.

As disclosed in Patent Literatures 1 to 3, use of cerium oxide abrasive grains for specific CMP applications such as STI is known.

CITATION LIST

Patent Literatures

Patent Literature 1: WO 2004/010487 A
Patent Literature 2: WO 2008/032681 A
Patent Literature 3: JP 2011-181946 A

SUMMARY OF INVENTION

<Summary of Invention>

However, cerium oxide abrasive grains are generally expensive and also disadvantageous in that they easily precipitate, thereby being poor in storage stability. Therefore, there has been a need for substituting other abrasive grains such as colloidal silica for cerium oxide abrasive grains.

When a polishing composition containing other abrasive grains in place of cerium oxide abrasive grains is used in the same application, the important thing is how to inhibit the polishing rate of a layer that contains a substance having a pH range exhibiting a positive zeta potential in an aqueous solution of pH 6 or lower (for example, silicon nitride) without decreasing the polishing rate of the polishing composition for silicon oxide.

Accordingly, an objective of the present invention is to provide a polishing composition usable as an alternative of a polishing composition containing cerium oxide abrasive grains in specific CMP applications such as STI and also to provide a polishing method and a method for producing a substrate using the polishing composition.

In order to solve the above problems, the inventors of the present invention conducted intensive studies. As a result, it was found that, by using a polishing composition being used in applications for polishing a layer that contains a substance having a pH range presenting a positive zeta potential in an aqueous solution of pH 6 or lower, wherein the polishing composition contains abrasive grains (A), abrasive grains (B), and a pH adjusting agent, and the abrasive grains (B) has a negative zeta potential in an aqueous solution of pH 6 or lower, and the value of the average secondary particle diameter of the abrasive grains (B) is less than the value of the average secondary particle diameter of the abrasive grains (A) and is 15 nm or less and the polishing composition has a pH of 6 or lower, the above problems can be solved. Based on the above finding, the present invention is completed accordingly.

In order to achieve at least one of the purposes described above, the polishing composition reflecting one aspect of the present invention is as described below.

That is, the present invention is a polishing composition being used in applications for polishing a layer that contains a substance having a pH range presenting a positive zeta potential in an aqueous solution of pH 6 or lower, wherein the polishing composition contains abrasive grains (A), abrasive grains (B), and a pH adjusting agent, and the abrasive grains (B) has a negative zeta potential in an aqueous solution of pH 6 or lower, and the value of the average secondary particle diameter of the abrasive grains (B) is less than the value of the average secondary particle diameter of the abrasive grains (A) and is 15 nm or less and the polishing composition has a pH of 6 or lower.

DESCRIPTION OF EMBODIMENTS

<Description of Preferred Embodiments>

Hereinbelow, the embodiments of the present invention are described. Incidentally, the present invention is not limited to the following embodiments. Furthermore, in the present description, "X to Y" indicating a range means "X or more and Y or less", and "weight" and "mass", "% by weight" and "% by mass", and "parts by weight" and "mass by weight" are treated as synonyms, respectively. Furthermore, unless specifically described otherwise, operations and measurements of a physical property or the like are carried out at conditions including room temperature (20 to 25° C.) and relative humidity of 40 to 50%.

The present invention is a polishing composition being used in applications for polishing a layer that contains a substance having a pH range presenting a positive zeta potential in an aqueous solution of pH 6 or lower, wherein the polishing composition contains abrasive grains (A), abrasive grains (B), and a pH adjusting agent, and the abrasive grains (B) has a negative zeta potential in an aqueous solution of pH 6 or lower, and the value of the average secondary particle diameter of the abrasive grains (B) is less than the value of the average secondary particle diameter of the abrasive grains (A) and is 15 nm or less and the polishing composition has a pH of 6 or lower.

By having the above constitution, it is possible to inhibit the polishing rate of a layer that contains a substance having a pH range exhibiting a positive zeta potential in an aqueous solution of pH 6 or lower.

Accordingly, with the above constitution, it is possible to provide a polishing composition that can be used as an alternative of a polishing composition containing cerium oxide abrasive grains in CMP applications like STI, and also to provide a polishing method and a method for producing a substrate using the polishing composition.

Although the detailed reason for having an inhibition of the polishing rate of a layer that contains a substance having a pH range exhibiting a positive zeta potential in an aqueous solution of pH 6 or lower in accordance with use of the polishing composition of the present invention remains unclear, it is believed to be related with the following mechanism.

In the present invention, the abrasive grains (B) have a negative zeta potential. On the other hand, an object to be polished has a layer that contains a substance having a pH range exhibiting a positive zeta potential. In an aqueous solution of pH 6 or lower, an electrically attracting force is present between the abrasive grains (B) and a layer that contains a substance having a pH range exhibiting a positive zeta potential, and thus the abrasive grains (B) is adsorbed on the layer. At that time, if there are abrasive grains with large average secondary particle diameter, a high polishing rate is exhibited. However, if the average secondary particle diameter is 15 nm or less, it is believed that the abrasive grains exhibit an activity of protecting a surface of substrate. Furthermore, according to the present invention, the abrasive grains (A) having a greater value of the average secondary particle diameter than that of the abrasive grains (B) are contained. For such reasons, polishing rate can be exhibited for a layer which contains a substance on which adsorption of the abrasive grains (B) is relatively difficult to occur. According to common knowledge of a person skilled in a prior art, it is believed that a mechanical action is high when abrasive grains and a layer as an object to be polished are in a relationship of attracting each other, and as a result, a high polishing rate would be exhibited. However, the present invention is based on the finding that, as the abrasive grains satisfy certain conditions, they have an activity of protecting a surface of an object to be polished. Based on this finding, the present invention is completed accordingly.

Meanwhile, the above mechanism is based on a presumption, and the present invention is not at all limited to the above mechanism.

[Polishing Object]

The object to be polished of the present invention is a layer that contains a substance having a pH range exhibiting a positive zeta potential in an aqueous solution of pH 6 or lower. Specific examples of the substance having a pH range exhibiting a positive zeta potential in an aqueous solution of pH 6 or lower include a nitride such ash silicon nitride, titan nitride, aluminum nitride, or tungsten nitride, and an alloy such as aluminum-magnesium or silicon-germanium.

The zeta potential of those materials can be measured by mixing the microparticles as a measurement object with an aqueous solution of pH 6 or lower and carrying out a measurement by a laser Doppler method or the like.

Those materials can be used either singly or in combination of two or more types.

A substrate which has a layer that contains a substance having a pH range exhibiting a positive zeta potential in an aqueous solution of pH 6 or lower is also the object to be polished of the present invention.

Next, the constitution of the polishing composition of the present invention is described in detail.

[Abrasive Grains]

The polishing composition of the present invention essentially contains, as a specific constitutional component, two kinds of abrasive grains with different particle diameters (average secondary particle diameter). Furthermore, it is necessary that one of those two kinds of abrasive grains has a negative zeta potential in an aqueous solution of pH 6 or lower, the average secondary particle diameter of those grains has a lower value than the average secondary particle diameter of the other abrasive grains, and it is 15 nm or less (such grains are conveniently referred to as the "abrasive grains (B)" in the present specification).

It is also possible to contain 3 or more kinds of abrasive grains (3 or more kinds of abrasive grains with different average secondary particle diameter may be contained). In that case, at least one of 3 or more kinds of abrasive grains has the average secondary particle diameter of 15 nm or less (such grains are conveniently referred to as the "abrasive grains (B)") and at least one of 3 or more kinds of abrasive grains has the average secondary particle diameter of more than 15 nm (such grains are conveniently referred to as the "abrasive grains (A)").

[Abrasive Grains (A)]

The abrasive grains (A) contained in the polishing composition may be silica such as colloidal silica, fumed silica, or precipitating silica, or those other than silica such as zirconia, alumina, or titania. However, the abrasive grains (A) contained in the polishing composition is preferably silica and particularly preferably colloidal silica.

Type of the colloidal silica to be used is not particularly limited. For example, surface-modified colloidal silica can be used. Surface modification of colloidal silica can be carried out by mixing a metal such as aluminum, titan, or zirconium, or an oxide thereof with colloidal silica and doping them on a surface of silica particle.

Alternatively, it can be carried out by chemical bonding of a functional group of an organic acid on a surface of silica particle, that is, immobilization of an organic acid.

Only by making the colloidal silica and the organic acid coexist, the organic acid is not immobilized to the colloidal silica. For example, sulfonic acid as an organic acid can be immobilized to colloidal silica by a method described in "Sulfonic acid-functionalized silica through of thiol groups", Chem. Commun. 246-247 (2003). Specifically, colloidal silica of which surface is immobilized with sulfonic acid can be obtained by coupling a silane coupling agent having a thiol group such as 3-mercaptopropyl trimethoxysilane to colloidal silica and then oxidizing the thiol group with hydrogen peroxide.

Alternatively, carboxylic acid as an organic acid can be immobilized to colloidal silica by a method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, colloidal silica of which surface is immobilized with carboxylic acid can be obtained by coupling a silane coupling agent containing a photoreactive 2-nitrobenzyl ester to colloidal silica and then irradiating the resulting product with light.

Among them, from the viewpoint of easy production, particularly preferred is colloidal silica immobilized with sulfonic acid.

When the abrasive grains (A) contained in the polishing composition is colloidal silica on which an organic acid is immobilized, a polishing composition with particularly excellent storage stability is obtained. This is because that colloidal silica on which an organic acid is immobilized tends to exhibit a larger absolute value of the zeta potential in the polishing composition, as compared to standard colloidal silica, on which an organic acid is not immobilized. As the absolute value of the zeta potential in the polishing composition increases, the electrostatic repulsive force between the silica particles is increased, and thus it is less likely to have an aggregation of the colloidal silica which is caused by an attracting force based on van der Waals force. In an acidic pH region, for example, colloidal silica on which an organic acid is immobilized typically exhibits a negative zeta potential value of −15 mV or less, while standard colloidal silica exhibits a zeta potential value close to zero. This is also the same for other abrasive grains which contain the abrasive grains (B). Meanwhile, the negative zeta potential is preferably less than 0 mV, and more preferably less than −10 mV.

The content of the abrasive grains (A) in the polishing composition is preferably 0.1% by mass or more, more preferably 0.5% by mass or more, still more preferably 1% by mass or more, and even still more preferably 5% by mass or more. When the content is 0.1% by mass or more, there is an advantageous effect of having increased polishing rate of the polishing composition for a layer other than the layer that contains a substance having a pH range exhibiting a positive zeta potential in an aqueous solution of pH 6 or lower.

The content of the abrasive grains (A) in the polishing composition is also preferably 25% by mass or less, more preferably 20% by mass or less, and still more preferably 15% by mass or less. As the content of the abrasive grains (A) decreases, the material cost of the polishing composition is reduced and the abrasive grains are less likely to aggregate. In addition, a polished surface with fewer scratches is easily obtained by polishing the object to be polished using the polishing composition.

The average primary particle diameter of the abrasive grains (A) is preferably 10 nm or more, more preferably 12 nm or more, and still more preferably 15 nm or more. When the average primary particle diameter of the abrasive grains (A) is 10 nm or more, there is an advantageous effect of having increased polishing rate of the polishing composition for a layer other than the layer that contains a substance having a pH range exhibiting a positive zeta potential in an aqueous solution of pH 6 or lower.

Meanwhile, the average primary particle diameter value of the abrasive grains can be calculated, for example, based on the specific surface area of the abrasive grains which is determined by the BET method.

The average primary particle diameter of the abrasive grains (A) is also preferably 100 nm or less, more preferably 90 nm or less, still more preferably 80 nm or less, and even still more preferably 50 nm or less. As the average primary particle diameter of the abrasive grains decreases, a polished surface with fewer scratches is easily obtained by polishing the object to be polished using the polishing composition.

The average secondary particle diameter of the abrasive grains (A) is preferably 250 nm or less, more preferably 200 nm or less, still more preferably 180 nm or less, even still more preferably 100 nm or less, and particularly preferably 80 nm or less.

The average secondary particle diameter value of the abrasive grains can be determined by, for example, the laser light scattering method, and it indicates a value which is calculated by using, as a measurement apparatus, dynamic light scattering type particle size distribution apparatus UPA-UT151 manufactured by Nikkiso Co., Ltd.

As the average secondary particle diameter of the abrasive grains (A) decreases, a polished surface with fewer scratches is easily obtained by polishing the object to be polished using the polishing composition. Furthermore, there is an advantageous effect of having increased polishing rate of the polishing composition for a layer other than the layer that contains a substance having a pH range exhibiting a positive zeta potential in an aqueous solution of pH 6 or lower.

Furthermore, there is an effect of inhibiting the polishing rate for a layer that contains a substance having a pH range exhibiting a positive zeta potential in an aqueous solution of pH 6 or lower (for example, silicon nitride).

The value of the average secondary particle diameter of the abrasive grains (A) needs to be higher than the value of the average secondary particle diameter of the abrasive grains (B), and thus it is preferably 15 nm or more, and more preferably 20 nm or more.

If the average secondary particle diameter of the abrasive grains (A) is 15 nm or more, there is an advantageous effect of having increased polishing rate by the polishing composition for a layer other than the layer that contains a substance having a pH range exhibiting a positive zeta potential in an aqueous solution of pH 6 or lower.

The average degree of association of the abrasive grains (A) is preferably 1.2 or more, and more preferably 1.5 or more. The average degree of association is obtained by dividing the average secondary particle diameter value of the abrasive grains by the average primary particle diameter value thereof. When the average degree of association of the abrasive grains (A) is 1.2 or more, there is an advantageous effect of having increased polishing rate for a layer other than the layer that contains a substance having a pH range exhibiting a positive zeta potential in an aqueous solution of pH 6 or lower.

The average degree of association of the abrasive grains (A) is also preferably 4 or less, more preferably 3.5 or less, and still more preferably 3 or less. As the average degree of association of the abrasive grains decreases, a polished surface with fewer scratches is easily obtained by polishing an object to be polished using the polishing composition.

[Abrasive Grains (B)]

The abrasive grains (B) contained in the polishing composition has essential conditions that it has a negative zeta potential in an aqueous solution of pH 6 or lower, and the value of the average secondary particle diameter is less than the value of the average secondary particle diameter of the abrasive grains (A) and is 15 nm or less.

As long as the above conditions are satisfied, abrasive grains (B) may be silica such as colloidal silica, fumed silica, or precipitating silica, or those other than silica such as zirconia, alumina, or titania. However, the abrasive grains contained in the polishing composition is preferably silica, and particularly preferably colloidal silica from the viewpoint of reducing defects (scratches) to an object to be polished and a polishing rate of an object to be polished.

Type of the colloidal silica to be used is not particularly limited. For example, surface-modified colloidal silica can be used. Descriptions made in relation to the surface modification of the abrasive grains (A) are also applied herein. As described above, in a preferred embodiment of the present invention, the abrasive grains (B) is (colloidal) silica of which surface is immobilized with an organic acid. Among them, from the viewpoint of easy production, particularly preferred is colloidal silica immobilized with sulfonic acid.

The content of the abrasive grains (B) is preferably 0.001% by mass or more, more preferably 0.002% by mass or more, still more preferably 0.005% by mass or more, and even still more preferably 0.01% by mass or more. When the content of the abrasive grains (B) is 0.001% by mass or more, there is an advantageous effect of having decreased polishing rate by the polishing composition for a layer like silicon nitride, which is a substance having a pH range exhibiting a positive zeta potential in an aqueous solution of pH 6 or lower.

The content of the abrasive grains (B) is also preferably 5% by mass or less, more preferably 3% by mass or less, still more preferably 1% by mass or less, and even still more preferably 0.1% by mass or less. As the content of the abrasive grains (B) decreases, the material cost of the polishing composition is reduced and the abrasive grains are less likely to aggregate.

The average primary particle diameter of the abrasive grains (B) is preferably 2 nm or more, more preferably 3 nm or more, and still more preferably 5 nm or more. As the average primary particle diameter of the abrasive grains increases, there is an advantageous effect of having decreased polishing rate by the polishing composition for a layer like silicon nitride which is a substance having a pH range exhibiting a positive zeta potential in an aqueous solution of pH 6 or lower. Meanwhile, the average primary particle diameter value of the abrasive grains can be calculated, for example, based on the specific surface area of the abrasive grains which is determined by the BET method.

The average primary particle diameter of the abrasive grains (B) is also preferably 15 nm or less, more preferably 14 nm or less, and still more preferably 13 nm or less.

The average secondary particle diameter of the abrasive grains (B) is preferably 15 nm or less, more preferably 14 nm or less, and still more preferably 13 nm or less, from the viewpoint of selection ratio.

The average secondary particle diameter value of the abrasive grains (B) can be determined by, for example, the laser light scattering method.

If the average secondary particle diameter of the abrasive grains (B) is more than 15 nm, the advantageous effect by the polishing composition to lower the polishing rate for a layer like silicon nitride, which is a substance having a pH range exhibiting a positive zeta potential in an aqueous solution of pH 6 or lower, is lost.

The average secondary particle diameter of the abrasive grains (B) is preferably 2 nm or more, more preferably 3 nm or more, and even more preferably 4 nm or more. As the average secondary particle diameter of abrasive grains increases, more fine adjustment of the SiN polishing rate can be achieved.

The average degree of association of the abrasive grains (B) is preferably 1.0 or more. As the average degree of association of the abrasive grains increases, there is an advantageous effect of having decreased polishing rate by the polishing composition for a layer like silicon nitride which is a substance having a pH range exhibiting a positive zeta potential in an aqueous solution of pH 6 or lower.

The average degree of association of the abrasive grains (B) is also preferably 4 or less, more preferably 3 or less, and still more preferably 2 or less. As the average degree of association of the abrasive grains decreases, a polished surface with fewer scratches is easily obtained by polishing an object to be polished using the polishing composition.

Furthermore, according to a preferred embodiment of the present invention, average secondary particle diameter of the abrasive grains (A)/average secondary particle diameter of the abrasive grains (B) is preferably from 3.5 to 15, and more preferably from 4 to 14.

Furthermore, according to a preferred embodiment of the present invention, the content of the abrasive grains (A)/content of the abrasive grains (B) is preferably from 10 to 500, more preferably from 20 to 300, and even more preferably from 50 to 300. By adding an extremely small amount of abrasive grains with small particle diameter, the activity of protecting a surface of substrate by abrasive grains can be exhibited and the polishing rate for silicon nitride can be lowered.

[pH and pH Adjusting Agent]

The pH of the polishing composition of the present invention is 6 or lower. If it is higher than pH 6, the polishing rate for a layer containing a substance having a pH range exhibiting a positive zeta potential in an aqueous solution of pH 6 or lower cannot be inhibited. It is sufficient that the pH of the polishing composition of the present invention is 6 or lower. More preferably, it is 4 or lower. It the pH is 6 or lower, there is an advantageous effect of having increased polishing rate by the polishing composition for a layer other than the layer that contains a substance having a pH range exhibiting a positive zeta potential in an aqueous solution of pH 6 or lower (silicon oxide or the like).

For adjusting the pH of the polishing composition to a desired value, a pH adjusting agent is used.

Examples of the pH adjusting agent to be used include inorganic acid, organic acid, a chelating agent, and alkali. They may be used either singly or in combination of 2 or more types.

Specific examples of the inorganic acid which can be used as a pH adjusting agent include hydrochloric acid, sulfuric acid, nitric acid, fluoride acid, boric acid, carbonic acid, hypophosphorous acid, phosphorous acid, and phosphoric acid. Among them, preferred are hydrochloric acid, sulfuric acid, nitric acid, and phosphorous acid.

Specific examples of the organic acid which can be used as a pH adjusting agent include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furan carboxylic acid, 2,5-furan dicarboxylic acid, 3-furan carboxylic acid, 2-tetrahydrofuran carboxylic acid, methoxy acetic acid, methoxy phenyl acetic acid, and phenoxy acetic acid. An organic sulfuric acid such as methane sulfonic acid, ethane sulfonic acid, or isethionic acid can be also used. Among them, preferred are dicarboxylic acid such as malonic acid, succinic acid, glutaric acid, adipic acid, pimelic acid, maleic acid, phthalic acid, malic acid, or tartaric acid and tricarboxylic acid such as citric acid.

Instead of an inorganic acid or an organic acid or in combination with an inorganic acid or an organic acid, salts like an ammonium salt or an alkali salt of an inorganic acid or an organic acid can be also used as a pH adjusting agent. In the case of a combination of weak acid and strong base, strong acid and weak base, or weak acid and weak base, it is expected to have a pH buffering activity.

Specific examples of the chelating agent which may be used as a pH adjusting agent include hydroxyethylimino diacetic acid, imino diacetic acid, acetamide imino diacetic acid, nitrilo tripropanoic acid, nitrilo trimethylphosphonic acid, nitrilo triacetic acid, diethylene triamine pentaacetic acid, and ethylene diamine tetraacetic acid.

Specific examples of the alkali which may be used as a pH adjusting agent include ammonia, sodium hydroxide, potassium hydroxide, and tetramethyl ammonium hydroxide. A content of the pH adjusting agent can be selected by suitably controlling it within a range in which the effect of the present invention is exhibited.

[Other Components]

The polishing composition of the present invention may contain, if necessary, other component such as water, inorganic salts, a surfactant, a water soluble polymer, a preservative, an anti-mold agent, or an organic solvent to dissolve a poorly soluble organic substance. Hereinbelow, water, inorganic salts, a surfactant, a polymer, a preservative, and an anti-mold agent as other component are described.

[Water]

The polishing composition of the present invention preferably contains water as a dispersion medium or a solvent for dispersing or dissolving each component.

From the viewpoint of suppressing inhibiting the activity of other components, it is preferable that water contains impurities at as low amount as possible. Specifically, pure water or ultra-pure water obtained by removing foreign matters through a filter after impurity ions are removed using an ion exchange resin, or distilled water is preferable.

[Inorganic Salts]

The polishing composition of the present invention may contain inorganic salts. Specific examples of the inorganic salt that are added in the present invention include ammonium sulfate, magnesium chloride, potassium acetate, and aluminum nitrate.

[Surfactant]

The polishing composition of the present invention may contain a surfactant. The surfactant added in the present invention may be any of an anionic surfactant, a cationic surfactant, an amphoteric surfactant, and a nonionic surfactant.

Examples of the anionic surfactant include polyoxyethylene alkyl ether acetate, polyoxyethylene alkyl sulfate ester, alkyl sulfate ester, polyoxyethylene alkyl ether sulfate, alkyl ether sulfate, alkyl benzene sulfonate, alkyl phosphate ester, polyoxyethylene alkyl phosphate ester, polyoxyethylene sulfosuccinate, alkyl sulfosuccinate, alkyl naphthalene sulfonate, alkyl diphenyl ether disulfonic acid, and salts thereof, and the like.

Examples of the cationic surfactant include an alkyl trimethyl ammonium salt, an alkyl dimethyl ammonium salt, an alkyl benzyl dimethyl ammonium salt, and an alkylamine salt, and the like.

Examples of the amphoteric surfactant include alkyl betaine and alkylamine oxide, and the like.

Examples of the nonionic surfactant include polyoxyethylene alkyl ether, polyoxyalkylene alkyl ether, a sorbitan fatty acid ester, a glycerin fatty acid ester, a polyoxyethylene fatty acid ester, polyoxyethylene alkylamine, and alkyl alkanol amide, and the like.

Among these surfactants, polyoxyethylene alkyl ether acetate, polyoxyethylene alkyl ether sulfate, alkyl ether sulfate, alkyl benzene sulfonate, and polyoxyethylene alkyl ether are preferable. These surfactants have a high chemical or physical adsorption force on the surface of the object to be polished, and therefore can form a stronger protective film on the surface of the object to be polished. This is advantageous in view of improving the flatness of the surface of the object to be polished after the object to be polished is polished using the polishing composition of the present invention.

The lower limit of a content of the surfactant in the polishing composition is preferably 0.001 g/L or more, more preferably 0.005 g/L or more, and still more preferably 0.01 g/L or more. Furthermore, the upper limit of the content of the surfactant in the polishing composition is preferably 50 g/L or less, more preferably 25 g/L or less, and still more preferably 10 g/L or less. Within such a range, the flatness of the surface of the object to be polished after the object to be polished is polished using the polishing composition is improved, and also the polishing rate by the polishing composition for the object to be polished can be maintained.

[Water Soluble Polymer]

The polishing composition of the present invention may contain a water soluble polymer. Specific examples of the water soluble polymer added in the present invention include polystyrenesulfonic acid salt, polyisoprenesulfonic acid salt, polyacrylic acid salt, polymaleic acid, polyitaconic acid, polyvinyl acetic acid, polyvinyl alcohol, polyglycerin, polyvinyl pyrrolidone, a copolymer of isoprene sulfonic acid and acrylic acid, a copolymer of polyvinyl pyrrolidone polyacrylic acid, a copolymer of polyvinyl pyrrolidone vinyl acetate, a salt of naphthalene sulfonic acid formalin condensate, a copolymer of diallylamine hydrochloric acid sulfur dioxide, carboxymethyl cellulose, a salt of carboxymethyl cellulose, hydroxyethyl cellulose, hydroxypropyl cellulose, plurane, chitosan, and chitosan salts.

[Preservative and Anti-Mold Agent]

Examples of the preservative and anti-mold agent used in the present invention include an isothiazoline-based preservative such as 2-methyl-4-isothiazolin-3-one or 5-chloro-2-methyl-4-isothiazolin-3-one, paraoxybenzoate ester, and phenoxyethanol, and the like. These preservatives and fungicides may be used singly or in mixture of two or more kinds thereof.

[Method for Producing Polishing Composition]

A method for producing the polishing composition of the present invention is not particularly limited. For example, it can be obtained by stirring and blending the components constituting the polishing composition (including the abrasive grains (A), the abrasive grains (B), and a pH adjusting agent, for example), and if necessary, other components in a dispersion medium or a solvent like water.

Thus, according to the present invention, also provided is a method for producing a polishing composition which is used for an application of polishing a layer that contains a substance having a pH range presenting a positive zeta potential in an aqueous solution of pH 6 or lower, in which the method includes blending the abrasive grains (A), the abrasive grains (B) and a pH adjusting agent and the abrasive grains (B) has a negative zeta potential in an aqueous solution of pH 6 or lower and the value of the average secondary particle diameter of the abrasive grains (B) is less than the value of the average secondary particle diameter of the abrasive grains (A) and is 15 nm or less and further setting pH to be 6 or lower.

The temperature at the time of blending each component is not particularly limited, but it is preferably from 10 to 40° C. and a heating may be conducted in order to increase a dissolution rate. The blending time is not particularly limited, either.

[Polishing Method and Method for Producing Substrate]

As described above, the polishing composition of the present invention is preferably used for polishing a layer that contains a substance having a pH range presenting a positive zeta potential in an aqueous solution of pH 6 or lower.

Therefore, the present invention provides a method for polishing a polishing a layer that contains a substance having a pH range presenting a positive zeta potential in an aqueous solution of pH 6 or lower by using the polishing composition of the present invention. In addition, the present invention provides a method for producing a substrate including a process of polishing a layer that contains a substance having a pH range presenting a positive zeta potential in an aqueous solution of pH 6 or lower by the above-described polishing method.

As a polishing apparatus, it is possible to use a general polishing apparatus including a holder for holding a substrate having an object to be polished or the like, a motor having a changeable rotating speed or the like, and a polishing platen to which a polishing pad (polishing cloth) can be attached.

As the polishing pad, a general nonwoven fabric, polyurethane, a porous fluororesin, or the like can be used without any particular limitation. The polishing pad is preferably grooved such that a polishing liquid can be stored therein.

Polishing conditions are not particularly limited, either. For example, the rotational speed of the polishing platen is preferably from 10 to 500 rpm, and the pressure applied to a substrate having an object to be polished (polishing pressure) is preferably from 0.5 to 10 psi.

A method for supplying a polishing composition to a polishing pad is not particularly limited, either. For example, a method in which a polishing composition is supplied continuously using a pump or the like can be employed. The supply amount is not limited, but a surface of the polishing pad is preferably covered all the time with the polishing composition of the present invention.

After polishing is completed, the substrate is washed with running water, followed by drying the substrate by flicking off water droplets adhered onto the surface of the substrate by using a spin dryer or the like. Accordingly, a substrate having a layer that contains a substance having a pH range presenting a positive zeta potential in an aqueous solution of pH 6 or lower is obtained.

[Method for Inhibiting Polishing Rate]

As it is evident from the descriptions given above, also provided by the present invention is a method for inhibiting the polishing rate for a layer that contains a substance having a pH range presenting a positive zeta potential in an aqueous solution of pH 6 or lower, that is, a method for inhibiting the polishing rate in which the method includes polishing the layer with the polishing composition or a polishing composition obtained by the production method. Because the specific descriptions for the constitutional elements of such invention are the same as those given above, further descriptions are omitted herein.

EXAMPLES

The present invention will be described in more detail with the following Examples and Comparative Examples. However, the technical scope of the present invention is not limited to the following Examples.

Examples 1 to 8, Comparative Examples 1 to 4

A polishing composition was obtained with the composition shown in Table 1 by blending colloidal silica as the abrasive grains (A) and the abrasive grains (B) and a pH adjusting agent in water so as to set the polishing composition to be a pre-determined pH by using phosphoric acid for acidic side and potassium hydroxide for alkali side (blending temperature: about 25° C., blending time: about 10 minutes). Meanwhile, in Table 1, the description "-" indicates that the corresponding agent is not included.

The pH of the polishing composition was determined by a pH meter (model number F-72, manufactured by HORIBA, Ltd.). Meanwhile, pH was measured at liquid temperature 25° C.

Meanwhile, the abrasive grains (the abrasive grains (A) and the abrasive grains (B)) shown in Table 1 are all silica of which surface is immobilized with sulfonic acid, and they are manufactured by a method described in "Sulfonic acid-functionalized silica through quantitative oxidation of thiol groups", Chem. Commun. 246-247 (2003).

Furthermore, the average secondary particle diameter value was determined by the laser light scattering method using laser light, and as for the measurement device, dynamic light scattering type particle size distribution apparatus UPA-UT151 manufactured by Nikkiso Co., Ltd. was used.

By using the obtained polishing composition, the object to be polished was polished under the following conditions and the polishing rate was measured.

<Conditions for Polishing>

(1) Polishing machine: Polishing machine with single-side CMP
(2) Polishing pad: Polyurethane pad
(3) Pressure: 2 psi (about 28 kPa)
(4) Revolution number of platen: 100 rpm
(5) Revolution number of carrier: 100 rpm
(6) Flow rate of polishing composition: 100 ml/min
(7) Polishing time: 1 minute The polishing rate was calculated according to the following equation.

$$\text{Polishing rate [Å/min]} = \text{Amount of change in film thickness after polishing for 1 minute}$$

A silicon oxide film blanket wafer having a diameter of 200 mm was polished using each of the polishing compositions of Examples 1 to 8 and Comparative Examples 1 to 4 for 1 minute under the conditions described above and the polishing rate for silicon oxide is shown in the column "Polishing rate of silicon oxide" of Table 1. The polishing rate value for silicon oxide was determined by dividing by polishing time the difference in the thickness of each wafer before and after polishing, which was measured by using an optical interference type film thickness measuring device.

A silicon nitride film blanket wafer having a diameter of 200 mm was polished using each of the polishing compositions of Examples 1 to 8 and Comparative Examples 1 to 4 for 1 minute under the conditions described above and the polishing rate for silicon nitride is shown in the column "Polishing rate of silicon nitride" of Table 1. The polishing rate value for silicon nitride was determined by dividing by polishing time the difference in the thickness of each wafer before and after polishing, which was measured by using an optical interference type film thickness measuring device.

The value of polishing rate for silicon oxide determined for each of the polishing compositions of Examples 1 to 8 and Comparative Examples 1 to 4 and the value of polishing rate for silicon nitride determined for the same polishing composition are described in Table 1.

Meanwhile, in pH range (2 to 4) of the polishing composition of Examples, zeta potential of silicon nitride was positive.

TABLE 1

| | Abrasive grains A | | | | Abrasive grains B | | | | A/B | | | Polishing rate | | Selection | |
|---|---|---|---|---|---|---|---|---|---|---|---|---|---|---|---|
| | Secondary particle diameter [nm] | Primary particle diameter [nm] | Degree of association [-] | Amount [%] | Secondary particle diameter [nm] | Primary particle diameter [nm] | Degree of association [-] | Amount [%] | Secondary particle diameter ratio [-] | Content ratio [-] | pH | TEOS [A/min] | SIN [A/min] | ratio TEOS/SiN | Evaluation |
| Example 1 | 70 | 35 | 2.0 | 10 | 5 | 3 | 1.7 | 0.05 | 14.0 | 200 | 2.0 | 530 | 330 | 1.61 | ○ |
| Example 2 | 70 | 35 | 2.0 | 10 | 10 | 6 | 1.7 | 0.05 | 7.0 | 200 | 2.0 | 550 | 360 | 1.53 | ○ |
| Example 3 | 70 | 35 | 2.0 | 10 | 15 | 10 | 1.5 | 0.05 | 4.7 | 200 | 2.0 | 530 | 385 | 1.38 | ○ |
| Example 4 | 70 | 35 | 2.0 | 10 | 10 | 6 | 1.7 | 0.05 | 7.0 | 200 | 4.0 | 300 | 150 | 2.00 | ⊙ |
| Example 5 | 40 | 15 | 2.7 | 10 | 10 | 6 | 1.7 | 0.05 | 4.0 | 200 | 2.0 | 400 | 200 | 2.00 | ⊙ |
| Example 6 | 70 | 35 | 2.0 | 5 | 10 | 6 | 1.7 | 0.05 | 7.0 | 100 | 2.0 | 220 | 150 | 1.47 | ○ |
| Example 7 | 70 | 35 | 2.0 | 10 | 10 | 6 | 1.7 | 0.1 | 7.0 | 100 | 2.0 | 500 | 320 | 1.56 | ○ |
| Example 8 | 70 | 35 | 2.0 | 10 | 10 | 6 | 1.7 | 0.5 | 7.0 | 20 | 2.0 | 500 | 320 | 1.56 | ○ |
| Comparative Example 1 | 70 | 35 | 2.0 | 10 | — | — | — | — | — | — | 2.0 | 500 | 500 | 1.00 | X |
| Comparative Example 2 | 70 | 35 | 2.0 | 10 | 20 | 8 | 2.5 | 0.05 | 3.5 | 200 | 2.0 | 525 | 490 | 1.07 | X |
| Comparative Example 3 | 70 | 35 | 2.0 | 10 | 10 | 6 | 1.7 | 0.05 | 7.0 | 200 | 7.0 | 100 | 100 | 1.00 | X |
| Comparative Example 4 | 70 | 35 | 2.0 | 0 | 10 | 6 | 1.7 | 0.05 | 7.0 | 0 | 2.0 | 80 | 80 | 0.13 | X |

TEOS/SiN < 1.3: X
1.3 ≤ TEOS/SiN < 1.7: ○
1.7 ≤ TEOS/SiN < 1.7: ⊙

As shown in Table 1, when the polishing composition of Examples 1 to 8 is used, the result was obtained at the level at which the composition can be satisfactorily used for the purpose of lowering the polishing rate for silicon nitride compared to the composition of Comparative Example 1 in which the abrasive grains (B) is not added.

To study in more detail, it is suggested from Examples 1 to 3 that, because the abrasive grains (B) can more rapidly adsorb on SiN surface due to a decrease in the secondary particle diameter of the abrasive grains, a higher effect of lowering the SiN polishing rate is obtained. Meanwhile, according to Example 4, although the interaction between the abrasive grains and TEOS (van der Waals force) is lowered due to an increase in pH, and thus the TEOS polishing rate is lowered; as for the SiN, as the zeta potential becomes close to zero, the electric attracting force between the abrasive grains and SiN is lowered, and thus the SiN polishing is lowered and because the SiN polishing rate is inhibited more significantly, a higher selection ratio can be achieved as a result. Meanwhile, according to Example 5, when the secondary particle diameter of the abrasive grains (B) is small, a lower secondary particle diameter is yielded and a lower mechanical action on TEOS is exhibited. Accordingly, the TEOS polishing rate is lowered. In this regard, it is demonstrated that the SiN polishing rate is lowered for the same reason, and because the SiN polishing rate is inhibited more significantly, a higher selection ratio can be achieved as a result. In Example 6, it is demonstrated that, because the mechanical action is weak due to small content of the abrasive grains (A), the TEOS, SiN polishing rate is lowered. It is also demonstrated in Examples 7 and 8 that the SiN polishing rate can be inhibited even when the addition amount of the abrasive grains (B) is high.

On the other hand, according to Comparative Example 2 in which the abrasive grains (B) have an average secondary particle diameter of more than 15 nm, the polishing rate for silicon nitride cannot be lowered.

Furthermore, in Comparative Example 3 in which pH of the polishing composition is more than 6, not only the polishing rate for silicon nitride but also the polishing rate for the silicon oxide was greatly lowered. As such, the result was not obtained at the level at which the composition can be satisfactorily used for the purpose of lowering the polishing rate for silicon nitride while maintaining the polishing rate for silicon oxide.

The present application is based on the Japanese patent application No. 2014-057480 filed on Mar. 20, 2014, and a disclosed content thereof is incorporated herein as a whole by reference.

The invention claimed is:

1. A polishing composition being used in applications for polishing a layer that contains a substance having a pH range presenting a positive zeta potential in an aqueous solution of pH 6 or lower, wherein
   the polishing composition contains abrasive grains (A), abrasive grains (B), and a pH adjusting agent, and
   the abrasive grains (B) has a negative zeta potential in an aqueous solution of pH 6 or lower, and the value of the average secondary particle diameter of the abrasive grains (B) is less than the value of the average secondary particle diameter of the abrasive grains (A) and is less than 10 nm and
   the polishing composition has a pH of 6 or lower and wherein the abrasive grains (B) is colloidal silica of which surface is immobilized with an organic acid.

2. The polishing composition according to claim 1, wherein
   the substance having a pH range presenting a positive zeta potential in an aqueous solution of pH 6 or lower is silicon nitride.

3. A method for producing a polishing composition being used for an application of polishing a layer that contains a substance having a pH range presenting a positive zeta potential in an aqueous solution of pH 6 or lower comprising:
   blending abrasive grains (A), abrasive grains (B) and a pH adjusting agent, wherein the abrasive grains (B) has a negative zeta potential in an aqueous solution of pH 6 or lower, the value of the average secondary particle diameter of the abrasive grains (B) is less than the value of the average secondary particle diameter of the abrasive grains (A) and is less than 10 nm, and setting pH to be 6 or lower and wherein the abrasive grains (B) is colloidal silica of which surface is immobilized with an organic acid.

4. A polishing method for polishing a layer that contains a substance having a pH range presenting a positive zeta potential in an aqueous solution of pH 6 or lower comprising:

polishing the layer using the polishing composition according to claim 1.

5. A method for producing a substrate having a layer that contains a substance having a pH range presenting a positive zeta potential in an aqueous solution of pH 6 or lower, comprising a process of polishing the substrate by the polishing method according to claim 4.

6. A method for inhibiting polishing rate of a layer that contains a substance having a pH range presenting a positive zeta potential in an aqueous solution of pH 6 or lower, comprising:

polishing the layer using the polishing composition according to claim 1.

7. A polishing method for polishing a layer that contains a substance having a pH range presenting a positive zeta potential in an aqueous solution of pH 6 or lower comprising:

using the polishing composition produced by the production method according to claim 3.

8. A method for inhibiting polishing rate of a layer that contains a substance having a pH range presenting a positive zeta potential in an aqueous solution of pH 6 or lower comprising:

polishing the layer using the polishing composition produced by the production method according to claim 3.

* * * * *